United States Patent
Mi et al.

(10) Patent No.: US 7,031,041 B2
(45) Date of Patent: Apr. 18, 2006

(54) MICRO-OSCILLATING ELEMENT PROVIDED WITH TORSION BAR

(75) Inventors: Xiaoyu Mi, Kawasaki (JP); Osamu Tsuboi, Kawasaki (JP); Satoshi Ueda, Kawasaki (JP); Ippei Sawaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/053,880

(22) Filed: Feb. 10, 2005

(65) Prior Publication Data

US 2005/0134951 A1 Jun. 23, 2005

Related U.S. Application Data

(63) Continuation of application No. PCT/JP02/08281, filed on Aug. 14, 2002.

(51) Int. Cl.
*G02B 26/08* (2006.01)

(52) U.S. Cl. ...................... 359/224; 359/212

(58) Field of Classification Search ............... 359/201, 359/213, 214, 223, 224–226
See application file for complete search history.

(56) References Cited

U.S. PATENT DOCUMENTS

| 5,053,972 A | 10/1991 | Kurakake et al. |
| 5,583,688 A | 12/1996 | Hornbeck |
| 5,740,150 A | 4/1998 | Uchimaru et al. |
| 6,262,827 B1 | 7/2001 | Ueda et al. |

FOREIGN PATENT DOCUMENTS

| JP | 60-107017 | 6/1985 |
| JP | 4-243029 | 8/1992 |
| JP | 7-287177 | 10/1995 |
| JP | 9-146032 | 6/1997 |
| JP | 9-146034 | 6/1997 |
| JP | 10-62709 | 3/1998 |
| JP | 2001-13443 | 1/2001 |
| JP | 2002-131685 | 5/2002 |
| JP | 2002-214560 | 7/2002 |
| JP | 2002-250890 | 9/2002 |

OTHER PUBLICATIONS

Tsuboi O. et al., "A Rotational Comb-Driven Micromirror with a Large Deflection Angle and Low Drive Voltage," Technical Digest in IEEE Micro Electronics Mechanical Systems 2002—the 15th International Conference, Jan. 2002, pp. 532-535.

International Search Report for International Application PCT/JP2002/008281, mailed Dec. 3, 2002.

(Continued)

Primary Examiner—Euncha P. Cherry
(74) Attorney, Agent, or Firm—Staas & Halsey LLP

(57) ABSTRACT

A micro-oscillating element is provided with a frame (113) and a oscillating member (111) connected with the frame (113) via a connector (112). Each connector (112) includes two torsion bars (112a), each torsion bar (112a) being constructed so that the rigidity becomes relatively high toward the frame (113) and relatively low toward the oscillating member (111) by forming a plurality of holes (112b).

18 Claims, 13 Drawing Sheets

OTHER PUBLICATIONS

Japanese Patent Application 2002-250890 (Reference AF) was cited in the International Search Report for PCT/JP02/0281.

Japanese Patent Application 2002-131685 (Reference AG) was cited in the International Search Report for PCT/JP02/0281.

Japanese Patent Application 60-107017 (Reference AH) was cited in the International Search Report for PCT/JP02/0281.

Japanese Patent Application 4-243029 (Reference AI) was cited in the International Search Report for PCT/JP02/0281.

Japanese Patent Application 2002-241560 (Reference AJ) was cited in the International Search Report for PCT/JP02/0281.

Japanese Patent Application 7-287177 (Reference AK) corresponds to U.S. Patent 5,583,688 (Reference AD).

Japanese Patent Application 9-146034 (Reference AL) corresponds to U.S. Patent 5,740,150 (Reference AC).

Japanese Patent Application 10-62709 (Reference AM) corresponds to U.S. Patent 5,053,972 (Reference AB).

Japanse Patent Application 2001-13443 (Reference AN) corresponds to U.S. Patent 6,262,827 (Reference AA).

Mirror
Inner Frame

Frame
Outer Frame

Mirror
Inner Frame

Frame
Outer Frame

Mirror    Frame
Inner Frame    Outer Frame

Mirror    Frame
Inner Frame    Outer Frame

Mirror Inner Frame    Frame Outer Frame

Mirror Inner Frame    Frame Outer Frame

Mirror      Frame
Inner Frame   Outer Frame

Mirror      Frame
Inner Frame   Outer Frame

Mirror  
Inner Frame

Frame  
Outer Frame

Mirror Inner Frame    16C    Frame Outer Frame

Mirror
Inner Frame

Frame
Outer Frame

Mirror
Inner Frame

Frame
Outer Frame

Mirror       Frame
Inner Frame  Outer Frame

MICRO-OSCILLATING ELEMENT PROVIDED WITH TORSION BAR

This application is a continuing application, filed under 35 U.S.C. §111(a), of International Application PCT/JP2002/008281, filed Aug. 14, 2002, incorporated by reference herein.

TECHNICAL FIELD

The present invention relates to a micro-oscillating element provided with a torsion bar. It especially relates to a micro-mirror unit embedded in an optical device, such as an optical disk device to perform data recording and playback processing on an optical disk and an optical switching device, switching optical paths among a plurality of optical fibers.

BACKGROUND ART

A micro-mirror unit is provided with a mirror face for reflecting light and can change the light reflection direction by oscillating the mirror face. An electro-statically driven micro-mirror unit which utilizes static electricity for oscillating the mirror face is adopted in many optical devices. Electrostatically-driven micro-mirror units can be classified largely as two types: micro-mirror units manufactured by so-called surface micro-machining technology and micromirror units manufactured by so-called bulk micro-machining technology.

In the surface micro-machining technology, on a substrate, thin films of raw materials corresponding to the individual components are processed into desired patterns, and such patterns are accumulated in order, forming individual components such as a support, a mirror face, and an electrode section which constitute the chip and a sacrificial layer which is later removed. An electrostatically-driven micro-mirror unit manufactured by such surface micromachining technology is disclosed in JP-A-H0-7-287177 for example.

On the other hand, in the bulk micro-machining technology, a support, a mirror section, etc. are formed into desired shapes by etching the raw material substrate itself, and a mirror face and electrodes are formed as thin films as needed. An electrostatically-driven micro-mirror unit manufactured by such bulk micro-machining technology is disclosed in JP-A-H9-146032, H9-146034, H10-62709 and 2001-113443 for example.

Listed as a technical item required for a micro-mirror unit is that the flatness of the mirror face responsible for reflecting light is high. According to the surface micro-machining technology, because the mirror face which is finally formed is thin, the mirror face becomes easily curved, and high flatness is guaranteed only for those having a mirror face size of several tens of micrometers on one edge.

Conversely, according to the bulk micro-machining technology, because the mirror section is constructed by shaving the relatively-thick raw material substrate itself, and because a mirror face is installed on the mirror section, even if the mirror face has a larger area, its rigidity can be retained. As a result, a mirror face having high enough optical flatness can be formed. Therefore, in manufacturing a micro-mirror unit for which a mirror face of several 100 micrometers or longer in one edge is required, the bulk micro-machining technology is widely adopted.

Shown in FIG. 20 is a prior-art electrostatically-driven micro-mirror unit 400 manufactured by the bulk micro-machining technology. The micro-mirror unit 400 has construction where a mirror substrate 410 and a base substrate 420 are accumulated. The mirror substrate 410 comprises, as shown in FIG. 21, a mirror section 411, a frame 413, and a pair of torsion bars 412 which connect them. Installed on the surface of the mirror section 411 is a mirror face 411a. Installed on the back of the mirror section 411 are a pair of electrodes 414a and 414b.

On the other hand, installed on the base substrate 420 are, as shown in FIG. 20, an electrode 421a opposing the electrode 414a of the mirror section 411 and an electrode 421b opposing the electrode 414b.

With this kind of construction, if the electrode 421a of the base substrate 420 is made to be a negative pole in a state in which the electrodes 414a and 414b of the mirror section 411 are positively charged, for example, electrostatic attraction is generated between the electrode 414a and the electrode 421a, and the mirror section 411 turns in the direction of the arrow M3 while twisting the pair of torsion bars 412. The mirror section 411 turns to the angle where the electrostatic attraction between the electrodes and the total sum of the twisting resistance of the torsion bars 412 balance.

Conversely, if the electrode 421b is made to be a negative pole in a state in which the electrodes 414a and 414b of the mirror section are positively charged, electrostatic attraction is generated between the electrode 414b and the electrode 421b, and the mirror section 411 turns in the direction opposite to the arrow M3. By such oscillating driving of the mirror 411, the direction of light reflected by the mirror face 411a is switched.

As stated above, in the electrostatically-driven micromirror unit 400, the mirror section 411 turns to the angle where the electrostatic attraction between the electrodes and the total sum of the twisting resistance of the torsion bars 412 balance. In doing so, the degree of stress by twisting of each torsion bar 412 is not uniform in the lengthwise direction. Namely, the ends of each torsion bar 412 are connected to a movable mirror section 411 and a fixed frame 413, and when the mirror section 411 turns, the stress of twisting the torsion bar 412 concentrates to the connectors of both ends of the torsion bar 412.

As seen in FIG. 21, the width and thickness of each torsion bar 412 are constructed to be uniform. In addition, the width and thickness are set small in order to reduce the twisting resistance of each torsion bar 412 and thus reduce the driving electric power. As a result, when stress concentrates at both ends of each torsion bar 412, there is a high possibility that the torsion bar 412 will be destroyed at that spot. When the twisting angle of the torsion bar 412 (oscillating angle of the mirror section 411) is large and the twisting spring constant of the mirror section 411 is large (namely, the resonance frequency of the micro-mirror unit is high), that trend is high. Also, if the rigidity of the torsion bar 412 is uniform in the lengthwise direction, it is impossible to the meet various kinds of property requirements required of the micro-mirror unit 400.

DISCLOSURE OF THE INVENTION

The objective of the present invention is to provide a micro-oscillating element, especially a micro-mirror unit, which has a low possibility of destruction even if the torsion bar is constructed to meet various kinds of requirements, such as low twisting resistance, a large twisting angle, and high resonance frequency.

In order to achieve this objective, the present invention provides a micro-oscillating element provided with a frame and a oscillating member connected to the frame via connectors, where each connector contains at least one torsion bar provided with a rigidity adjustment means.

According to the above construction, the rigidity of the torsion bar can be adjusted by the rigidity adjustment means according to the operation properties required of the micro-oscillating element. For example, it is possible to increase the rigidity of one end or both ends of the torsion bar and to increase the twisting spring constant. Conversely, it is also possible to decrease the rigidity of one end or both ends of the torsion bar and to set the twisting resistance to be small and the twisting angle large. Also, if the rigidity distribution is adjusted so that the stress distribution of a torsion bar deformed by twisting becomes uniform in the lengthwise direction, the possibility of torsion bar destruction due to the concentration of stress can also be reduced.

According to the preferred embodiment of the present invention, each connector contains two torsion bars having an interval in the widthwise direction, constructed so that the interval between the two torsion bars increases toward the oscillating member and decreases as they approach the frame. If thus constructed, when the oscillating member rocks, while each torsion bar mainly develops twisting deformation on the frame side, because the oscillating member side is far from the oscillating axis center, the degree of twisting deformation is small, and thus bending deformation becomes the main deformation. Therefore, the end of each torsion bar is in a state where it is difficult for stress concentration to occur.

In such a presupposition, it is preferred that the rigidity adjustment means be constructed so that the rigidity of each torsion bar becomes relatively high toward the frame and relatively lower toward the oscillating member. With such construction, when the oscillating member rocks, the torsion bar has relatively small twisting and also a small twisting stress concentration near the frame, due to its high rigidity. In addition, because bending of the torsion bar accompanying oscillating of the oscillating member becomes the main bending near the oscillating member (where twisting the torsion bar is small), stress concentration due to twisting near the oscillating member is also small. As a result, it is difficult for stress concentration to occur by the oscillating member and its connection point to the frame, and the stress becomes uniformly distributed in the lengthwise direction of the torsion bar as a whole. Even if the oscillating member is rocked at a large oscillating angle, or the twisting spring constant of the torsion bar is set to be large to increase the resonance frequency of the oscillating member, it becomes difficult for the torsion bar to be destroyed.

The first means to adjust the rigidity of the torsion bar is to form a plurality of holes on the torsion bar to give variation to their size and arrangement pattern. The holes have the effect of reducing the rigidity of the torsion bar, and the greater the occupying ratio of the holes are, the stronger the effect becomes. Therefore, if the hole size varies so that it becomes smaller toward the frame and larger toward the oscillating member, the rigidity of the torsion bar becomes higher toward the frame and lower toward the oscillating member. On the other hand, if the size of the plurality of holes is made uniform, the same function can be obtained by varying the hole density to be smaller toward the frame and larger to ward the oscillating member.

The plurality of holes may penetrate the torsion bar in the thickness direction or in the widthwise direction. Furthermore, a part of the plurality of holes may penetrate the torsion bar in the thickness direction, and the rest of the plurality of holes may penetrate the torsion bar in the widthwise direction.

The second means to adjust the rigidity of the torsion bar is to give variation to the width and/or the thickness of the torsion bar. Namely, if the width and/or the thickness of the torsion bar are varied to become larger toward the frame and smaller toward the oscillating member, the rigidity of the torsion bar increases toward the frame and decreases toward the oscillating member.

The third means to adjust the rigidity of the torsion bar is to install a plurality of reinforcement ribs and to give a variation to the intervals of the reinforcement ribs. Namely, the intervals of the plurality of the reinforcement ribs are varied to be smaller toward the frame and larger toward the oscillating member, and the rigidity of the torsion bar increases toward the frame and decreases toward the oscillating member.

According to an embodiment where each connection unit contains two torsion bars, when the oscillating member attempts to rotate around an axis (the so-called z axis) which is perpendicular to a plane containing the two torsion bars, the torsion bars perform a thrusting action to prevent the rotation of the oscillating member around the z axis. Therefore, if the oscillating member is the mirror section of a micro-mirror unit, it can prevent the mirror section from reflecting light in an unintended direction.

The two torsion bars may deviated from each other in the thickness direction. By such construction, it becomes possible to connect the two torsion bars to two electrically-separated parts among the frame or oscillating member.

According to another preferred embodiment of the present invention, the frame constitutes an inner frame, and the connector is a connector which connects the inner frame to the oscillating member. Furthermore, an outer frame is connected via an outer connector to the inner frame, and each outer connection unit contains at least one outer torsion bar. The outer torsion bar is constructed so that its rigidity becomes relatively high toward the outer frame and relatively low toward the inner frame. Also, the oscillating axis of the outer connector intersects with the oscillating axis of the inner connector at a right angle. Specifically, the oscillating axis of the inner connector extends in the direction x, and the oscillating axis of the outer connector in the y direction.

According to this embodiment, a dual axis oscillating type micro-oscillating element can be constructed, and if the oscillating member has a mirror section, the degree of freedom in the light reflection direction increases.

Other objectives, characteristics, and advantages of the present invention will become clear from the preferred embodiments explained hereafter, based on the attached drawings.

BRIEF DESCRIPTION OF THE DRAWINGS

FIG. 7b is a cross-sectional view along a line 7B—7B in FIG. 7a.

FIG. 8b is a cross-sectional view along a line 8B—8B in FIG. 8a.

FIG. 9b is a cross-sectional view along a line 9B—9B in FIG. 9a.

FIG. 10b is a cross-sectional view along a line 10B—10B in FIG. 10a.

FIG. 11b is a cross-sectional view along a line 11B—11B in FIG. 11a.

FIG. 12b is a cross-sectional view along a line 12B—12B in FIG. 12a.

FIG. 12c is an elevation view seen in the direction of an arrow 12C in FIG. 12a.

FIG. 13b is a cross-sectional view along a line 13B—13B in FIG. 13a.

FIG. 14b is a cross-sectional view along a line 14B—14B in FIG. 14a.

FIG. 15b is a cross-sectional view along a line 15B—15B in FIG. 15a.

FIG. 15c is an elevation view seen in the direction of an arrow 15C in FIG. 15a.

FIG. 16b is a cross-sectional view along a line 16B—16B in FIG. 16a.

FIG. 16c is an elevation view seen in the direction of an arrow 16C in FIG. 16a.

FIG. 17b is a cross-sectional view along a line 17B—17B in FIG. 17a.

FIG. 18b is a cross-sectional view along a line 18B—18B in FIG. 18a.

FIG. 19b is a cross-sectional view along a line 19B—19B in FIG. 19a.

BEST MODE FOR CARRYING OUT THE INVENTION

Figure 1:
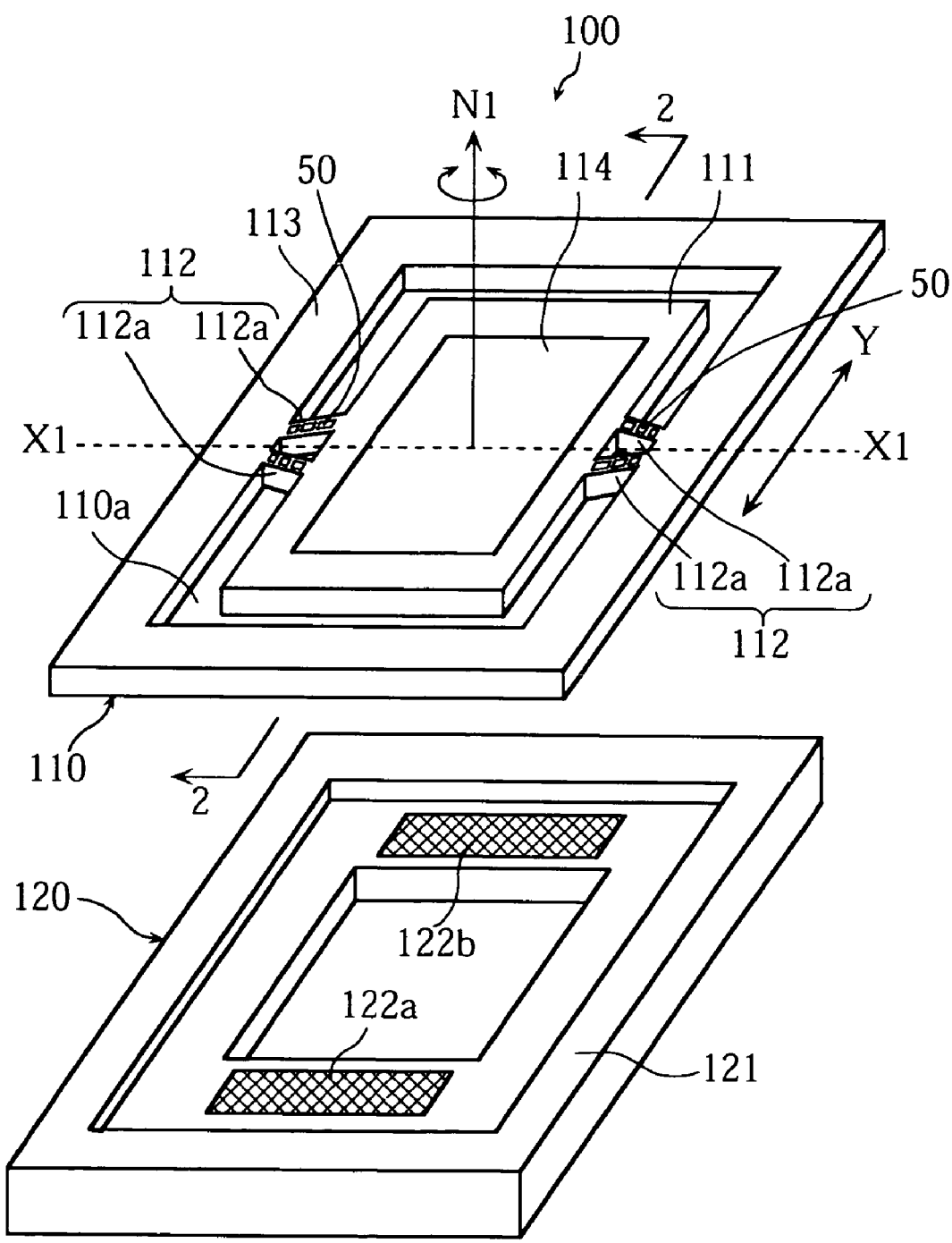
FIG. 1 is an exploded oblique view of a micro-mirror unit related to the first embodiment of the present invention.
Figure 2:
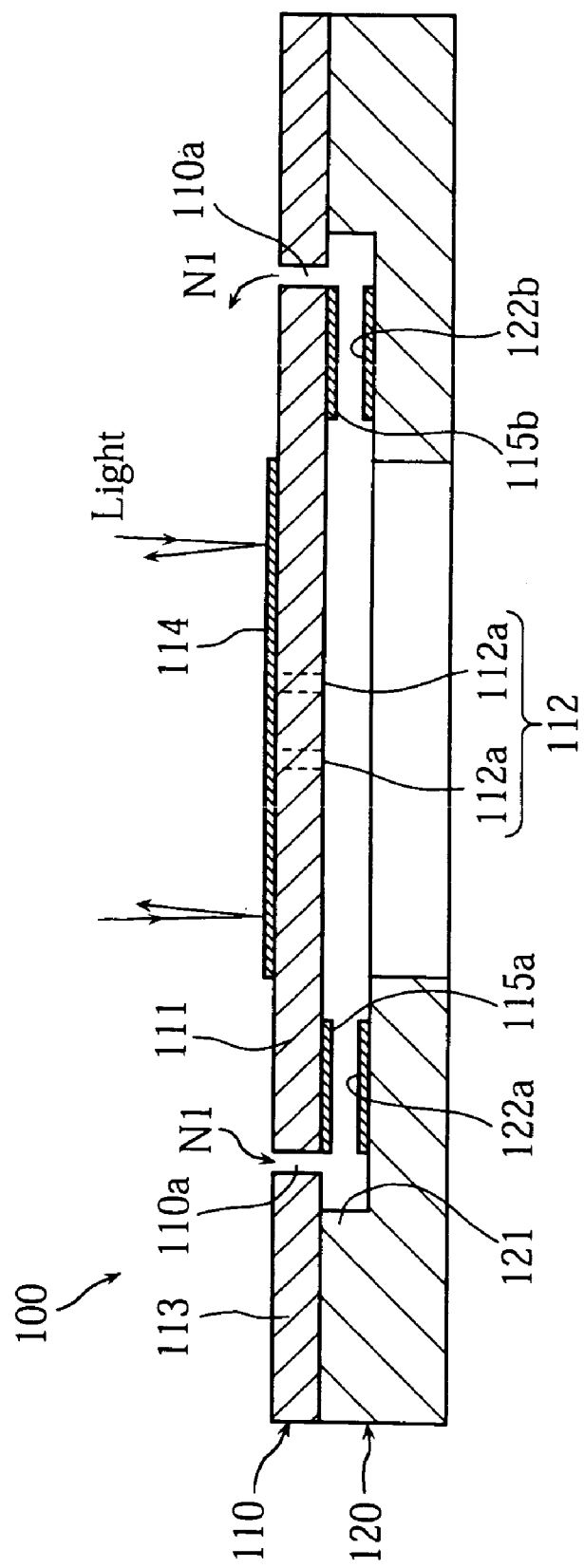
FIG. 2 is a cross-sectional view along a line 2—2 in the micro-mirror unit assembly state shown in FIG. 1.

Preferred embodiments of the present invention are explained hereafter, with reference to the drawings. Shown in FIGS. 1 and 2 is a micro-mirror unit 100 related to the first embodiment of the present invention. The micro-mirror unit 100 of the present invention has construction where a mirror substrate 100 and a base substrate 120 are accumulated.

As shown in FIG. 1, the mirror substrate 110 has a mirror section 111, a frame 113 which surrounds this mirror section 111, and a pair of twisting connector 112 which connect the fame 113 and a mirror section 111. The mirror substrate 110 is, for example, formed by bulk machining technology from a substrate made of silicon given conductivity by doping n-type impurities such as P and As and p-type impurities such as B. Specifically, an air gap section 110a is installed by performing dry etching such as Deep RIE (Deep Reactive Ion Etching) or wet etching with KOH solution etc. to a plate-shape conductive silicon substrate using an etching mask covering the mirror section 111, the frame 113, and the pair of twisting connector 112. As a result, the mirror section 111, the frame 113, and the pair of twisting connector 112 are cut out by the air gap section 110a. In the present embodiment, the width of each air gap section 110a between the mirror section 111 and the frame 113 is 10~200 µm for example, and the thickness of the mirror section 111 and the frame 113 is 10~200 µm for example.

As expressed well in FIG. 2, a mirror face 114 is installed on the surface of the mirror section 111, and a pair of electrodes 115a and 115b are installed on its back face. The mirror face 114 and electrodes 115a and 115b are formed by the vapor deposition of metal films, etc. However, when it is constructed so that the conductivity of the mirror substrate 110 is made to be high by the doping impurities, it is not necessary to install the electrodes 115a or 115b.

As expressed well in FIG. 1, each twisting connector 112 is connected as one unit in close proximity to the center of the side face of the mirror section 111 extending in the lengthwise direction and close to the center of the inner face of the frame 113 extending in the lengthwise direction. Thus, the micro-mirror unit 100 of the present embodiment is constructed as a one-axis type with its oscillating axis X1 regulated by the pair of twisting connector 112. In the present embodiment, each twisting connector 112 comprises two torsion bars 112a. In the two torsion bars 112a, the width of the twisting connector 112 (the Y-direction dimension in FIG. 1) is regulated. The width of the twisting connector 112 is 30~300 µm for example, where it is connected to the mirror section 111, and gradually becomes narrower from the mirror section 111 toward the frame 113, and is 1~30 µm where it is connected to the frame 113.

In the assembled state of the micro-mirror 100 as shown in FIG. 2, the bottom face of the frame 113 of the mirror section 111 is joined to the top face of a convex step section 121 of a base substrate 120. The base substrate 120 is provided with a pair of electrodes 122a and 122b which oppose the pair of electrodes 115a and 115b of the mirror section 111 at an appropriate interval. Namely, the micro-mirror unit 100 related to the present embodiment is constructed as the so-called plate electrode type.

According to such construction, in a state in which the electrodes 115a and 115b of the mirror section 111 are charged as positive poles for example, if the electrode 122a of the base substrate 120 is made to be a negative pole, electrostatic force is generated between them, and the mirror section 111 turns in the direction of the arrow N1 centering the oscillating axis X1 while twisting the pair of twisting connector 112. In lieu of this, if the electrode 122b is made to be a negative pole, the mirror section 111 turns in the direction opposite to the above. By oscillating the mirror section 111 in this way, the direction of reflection of the light which proceeds toward the mirror face 114 and is reflected at that mirror face 114 can be switched to a specified direction. During the oscillating of the mirror section 111, because the twisting connector 112 has a portion which is relatively narrow in width, the twisting resistance of the twisting connector 112 is reduced. At the same time, because the twisting connector 112 is connected to the mirror section 114 at a location which is relatively wide, rotation of the mirror section 111 around the arrow N1 can be suppressed well.

Providing the electrodes 115a and 115b of the mirror section 111 with voltage is performed via the frame 113, the twisting connector 112, and the mirror section 111 constructed of a conductive material. Providing the electrodes 122a and 122b of the base substrate 120 with voltage is performed via wiring (not shown) constructed of a conductive material installed on the base substrate 120 if necessary. In the mirror substrate 110 of the micro-mirror unit 100 of the present embodiment, because the mirror section 111, the twisting connector 112, and the frame 113 are constructed as one unit, and because a voltage can be applied appropriately to the electrodes 115a and 115b of the mirror section 111 via the twisting connector 112, unlike prior-art micro-mirror units, there is no need of separately forming the wiring for giving voltages to the electrodes 115a and 115b of the mirror substrate 110.

In order to drive the mirror section 111 of the micro-mirror unit 100, a comb electrode in place of a plate electrode may be installed. Also, in place of electrostatic force, electromagnetic force by an electromagnetic coil or a permanent magnet may be utilized. Specifically, the electrodes 115a and 115b of the mirror section 111 are replaced with electromagnetic coils, and the electrodes 122a and 122b of the base substrate with electromagnetic coils or permanent magnets. Or, the electrodes 115a and 115b of the mirror section are replaced with permanent magnets, and the electrodes 122a and 122b of the base substrate are replaced with electromagnetic coils. With such construction, the mirror section 111 can be driven by adjusting the conduction state to the electromagnetic coils.

Figure 7A:
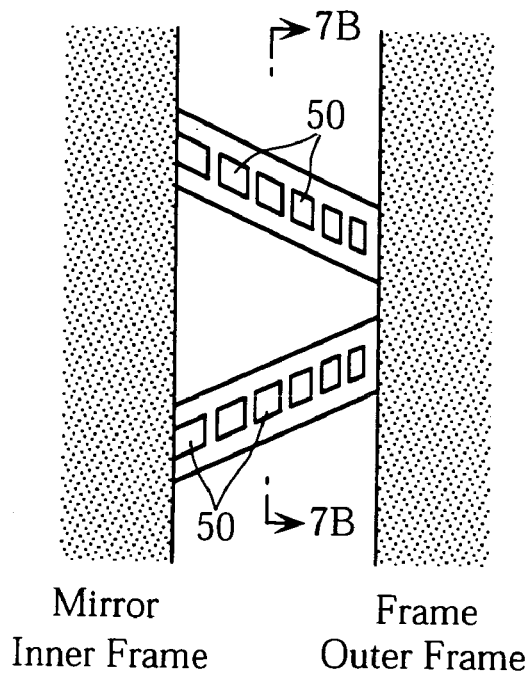
FIG. 7a is a partial expanded plan view showing the first example of the structure of a torsion bar which can be adopted in any of the embodiments.
Figure 7B:
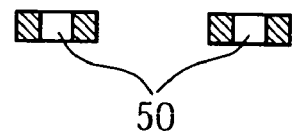

In the present embodiment, formed on each torsion bar 112a constituting the twisting connector 112 are a plurality of rigidity adjustment holes 50 which penetrates in the thickness direction. The formation pattern of the rigidity adjustment holes 50 can be made as shown in FIGS. 7a and 7b for example. Specifically, the rigidity adjustment holes 50 shown in FIG. 7a and FIG. 7b have a parallelogram-shaped cross-section, and are arranged so that its size increases toward the mirror section 111 and gradually decreases toward the frame 113. The rigidity adjustment holes 50 have the function of reducing the rigidity of the torsion bar 112a, and the larger the size of the holes 50, the larger the degree of its rigidity reduction function. Therefore, if the torsion bars 112a have uniform width and thickness, the closer to the mirror section 111, the lower the rigidity is, and the closer to the frame 113, the higher the rigidity is.

In the above construction, even if the mirror section 111 rocks centering the oscillating axis X1, twisting of the torsion bar 112a near the frame 113 is small due to its high rigidity. Therefore, it is difficult for twisting stress to concentrate near the frame 113 due to the relatively high rigidity. Furthermore, by making the rigidity of the torsion bar 112a to be high near the frame 113, it is possible to increase the twisting spring constant and to set the resonance frequency of the micro-mirror unit to be high.

On the other hand, the mirror section 111 side end of the torsion bar 112a is away from the oscillating axis X1, displacement in the perpendicular direction to the mirror face 114 becomes main following the oscillating of the mirror section 111. Therefore, the torsion bar 112a is rarely twisted in the mirror section 111 side, and bending deformation becomes main. As a result, also as to the mirror section 111 side end of the torsion bar 112a, stress concentration due to twisting is small, when seen as the whole of the torsion bar 112a, stress is uniformly scattered in its lengthwise direction. Furthermore, because the rigidity of the torsion bar 112a is reduced near the mirror section 111, the torsion bar 112a is easy to bend, and it becomes possible to reduce the driving power necessary for oscillating the mirror section 111 and increasing the oscillating angle of the mirror section 111.

For the above reasons, even if the oscillating member is rocked with a large oscillating angle, or the twisting spring constant of the torsion bar 112a is designed to be a large value in order to increase the resonance frequency of the mirror section 111, the torsion bar 112a becomes hard to be destroy.

It is rational that the rigidity adjustment holes 50 should be formed by the Deep RIE method simultaneous to the formation of the air gaps 110a on the mirror substrate 100 for example. However, they may be formed separately by laser irradiation or wet etching.

Figure 3:
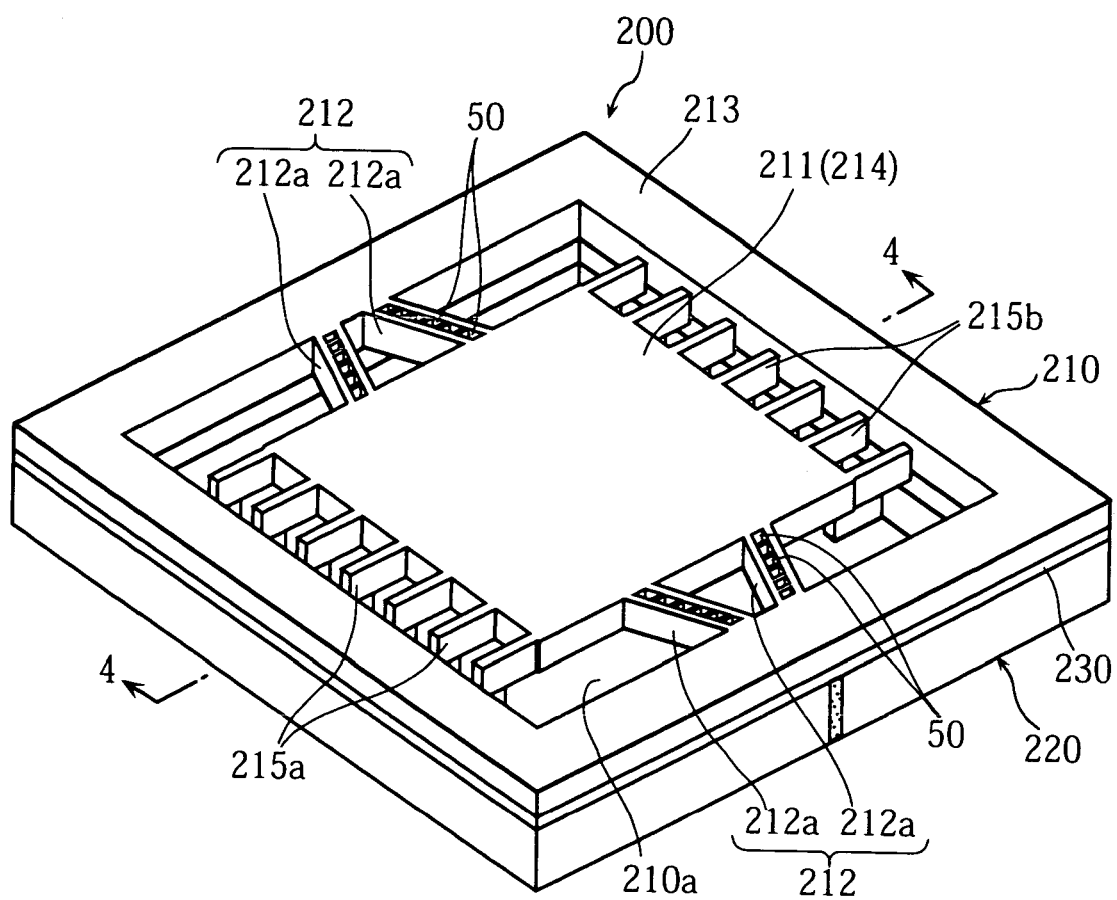
FIG. 3 is an oblique view of a micro-mirror unit related to the second embodiment of the present invention.
Figure 4:
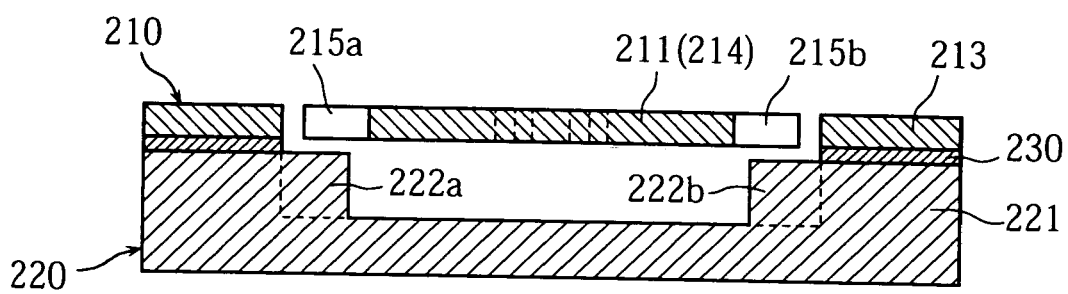
FIG. 4 is a cross-sectional view along the line 4—4 in FIG. 3.
Figure 5:
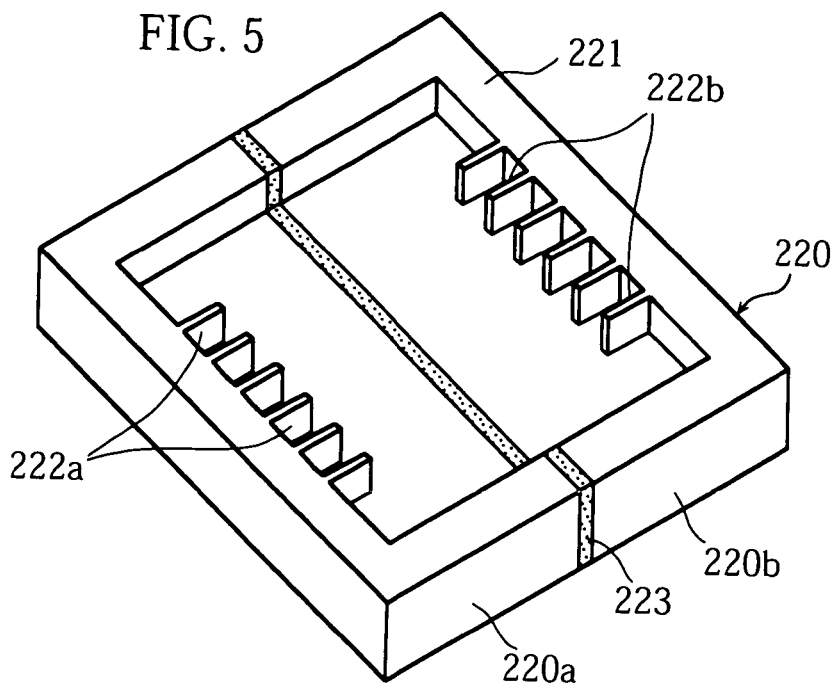
FIG. 5 is an oblique view showing a base substrate in the micro-mirror unit shown in FIG. 3.

Shown in FIGS. 3–5 is a micro-mirror unit 200 related to the second embodiment of the present invention. The micro-mirror unit 200 in the present embodiment has construction where a mirror substrate 210 and a base substrate 220 are accumulated via an insulation layer 230.

The mirror substrate 110 has, as shown in FIG. 3, a mirror section 211, a frame 213 which surrounds the mirror section 211, and a pair of twisting connectors 212 which connect the frame 213 and mirror section 211. The mirror substrate 210 is, for example, formed by means of bulk machining technology from a substrate made of silicon, and given conductivity by doping n-type impurities such as P and As and p-type impurity such as B. Specifically, an air gap section 210a is installed by performing dry etching such as Deep RIE or wet etching with a KOH solution etc. to a plate-shape conductive silicon substrate using an etching mask covering the mirror section 211, the frame 213, and the pair of twisting connectors 212. As a result, the mirror section 211, the frame 213, and the pair of twisting connector 212 are cut out by the air gap section 210a. In the present embodiment, the width of each air gap section 110a between the mirror section 111 and the frame 113 is 10~200 μm for example, and the thickness of the mirror section 111 and the frame 113 is 10~200 μm for example.

The surface of the mirror section 211 acts as a mirror face 214. Also, on two opposing side faces of the mirror section 211 the first comb electrodes 215a and 215b are formed extending out. These first comb electrodes 215a and 215b are formed simultaneously when the air gap 210a is formed by the Deep RIE.

Construction of each twisting connector 212 is basically the same with the one referred to in the first embodiment. Namely, each twisting connector 112 comprises two torsion bars 212a, and formed on each torsion bar 212a are a plurality of rigidity adjustment holes 50. Also, the formation pattern of the rigidity adjustment holes 50 is as shown in FIGS. 7a and 7b for example.

In the present embodiment, a base substrate 120 as well as a mirror substrate 210 is formed by the bulk machining technology from a substrate made of silicon given conductivity by doping n-type impurities such as P and As and p-type impurities such as B for example. Specifically, the central part of a plate-shape conductive silicon substrate is depressed and simultaneously the second comb electrodes 222a and 222b (see FIG. 5) are formed by performing dry etching such as the Deep RIE or wet etching using KOH solution. Whereas the second comb electrodes 222a and 222b correspond to the first comb electrodes 215a and 215b, they are swapped in terms of their positions. Therefore, it is arranged so that each comb electrode of the first comb electrodes can enter the air gap between comb electrodes of the second comb electrodes.

In a micro-mirror unit 200 in its assembled state, as shown in FIG. 4, the frame 213 of a mirror substrate 210 is joined with the top face of a convex step section 221 of a base substrate 220 via an insulation layer 230. The insulation layer 230 is installed because the second base substrate 220 is constructed of a conductive material due to the necessity of forming the second comb electrodes 222a and 222b in one unit, and the second base substrate 220 has to be electrically insulated from the mirror substrate 210.

Also, as shown in FIG. 5, the base substrate 220 has construction where the first conductive section 220a containing one second comb electrode 222a and the second conductive section 220b containing the other second comb electrode 222b are electrically insulated by an insulation layer 223. Such construction is necessary for charging two second comb electrodes 222a and 222b with different voltages. With construction such as the above, the mirror section 211 can be rocked forward and reversed by selectively making one of the second comb electrodes 122a and 222b of the base substrate 220 to be a negative pole in a state where the first comb electrodes 215a and 25b of the mirror section 211 are charged as positive poles. The width of each connector 212, is gradually reduced from the mirror section 211 to the frame 213, and a plurality of rigidity adjustment holes 50 are formed in the pattern shown in FIGS. 7a and 7b on each torsion bar 212a, in which respect the second embodiment is the same as the first embodiment. Therefore, the micro-mirror unit 200 of the second embodiment has the same advantage as the micro-mirror unit 100 of the first embodiment.

Figure 6:
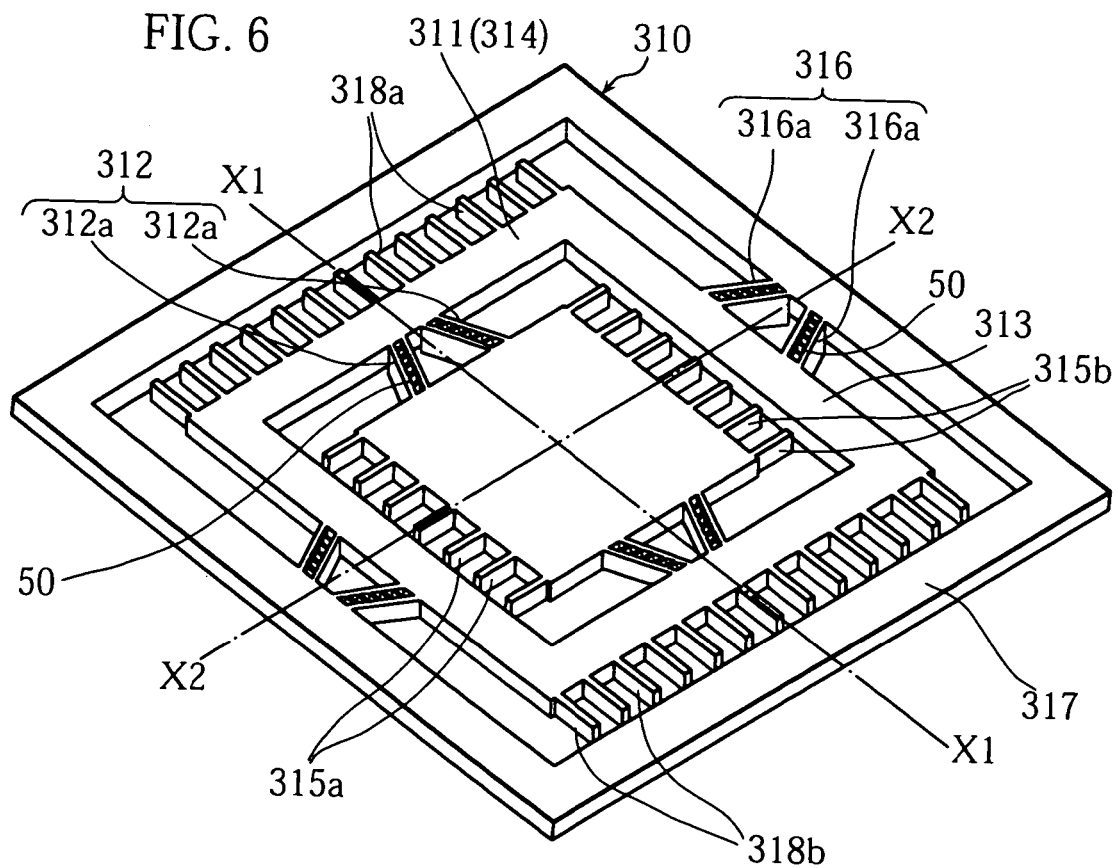
FIG. 6 is an oblique view of a micro-mirror unit of the third embodiment for of the present invention.

FIG. 6 shows only the construction of a mirror substrate 310 in a micro-mirror unit related to the third embodiment of the present invention. The mirror substrate 310 in the present embodiment is provided with a mirror section 311, an inner frame 313 which surrounds it, an outer frame 317 which surrounds the inner frame 313, a pair of first twisting connectors 312 which connect the mirror section 311 and the inner frame 313, and a pair of second twisting connectors 316 which connect the inner frame 313 and the outer frame 317. The first twisting connector 312 regulates the first oscillating axis X1 of the mirror section 311 relative to the inner frame 313. The second twisting connector 316 regulates the oscillating axis X2 of the inner frame 313 relative to the outer frame 317. In the present embodiment, the oscillating axis X1 and the second oscillating axis X2 intersect with each other perpendicularly. The materials and manufacturing method of the mirror substrate 310 are the same as those stated in the second embodiment.

In the present embodiment, the mirror section 311 has first comb electrodes 315a and 315b formed on both sides of the first oscillating axis X1, and the inner frame 313 has third comb electrodes 318a and 318b formed on both sides of the second oscillating axis X2. Although not shown, the mirror substrate 310 is joined to the base substrate via an insulation layer, and formed on this base substrate are third comb electrodes corresponding to the first comb electrodes 315a and 315b and fourth comb electrodes corresponding to the third comb electrodes 318a and 318b. Therefore, because the mirror section 311 can be rocked centering the first oscillating axis X1 and/or the second oscillating axis X2 by selectively charging voltage to the second comb electrodes and the fourth comb electrodes which are not shown, freedom in controlling the direction of light reflection increases.

In the third embodiment shown in FIG. 6, each of the first twisting connectors 312 has its width gradually decrease from the mirror section 311 to the inner frame 313, and a plurality of rigidity adjustment holes 50 are formed on each torsion bar 312a in the pattern shown in FIGS. 7a and 7b, in which respect it is the same as the first embodiment. Also, the construction of the second twisting connectors 316 is the same as the first twisting connector 312. Therefore; the advantages already stated for the first embodiment also apply as they are to the third embodiment.

In any of the embodiments explained above, as to the torsion bar 112a (212a, 312a, and 316a) the rigidity adjustment holes 50 are formed in the pattern shown in FIGS. 7a and 7b (first example). In this first example, the rigidity adjustment holes 50 have a parallelogram-shape cross section, and its size varies only in the lengthwise direction of the torsion bar. However, the same advantages can be obtained even if those having various kinds of constructions shown in FIG. 8a~FIG. 19b are adopted as the torsion bar.

Figure 8A:
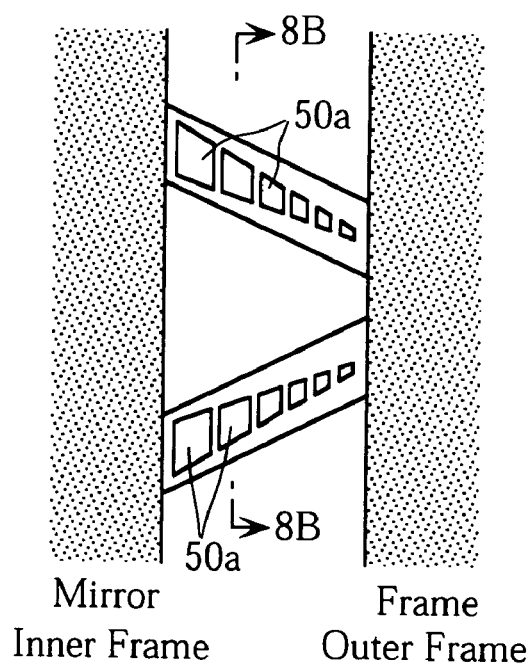
FIG. 8a is a partial expanded plan view showing the second example of the structure of a torsion bar which can be adopted in any of the embodiments.
Figure 8B:
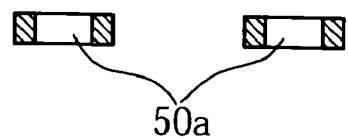

Namely, in the second example shown in FIGS. 8a and 8b, each torsion bar has a plurality of rigidity adjustment holes 50a of a rectangular cross section arranged in one row, and its size becomes larger toward the mirror section (or inner frame) and gradually decreases not only toward the frame (or outer frame) but also in the widthwise direction.

Figure 9A:
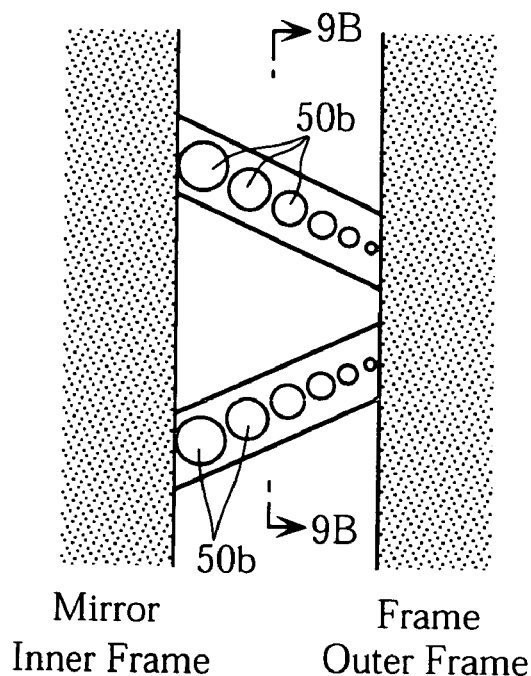
FIG. 9a is a partial expanded plan view showing the third example of the structure of a torsion bar which can be adopted in any of the embodiments.
Figure 9B:
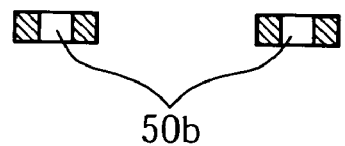

In the third example shown in FIGS. 9a and 9b, each torsion bar has a plurality of rigidity adjustment holes 50b of a circular cross section arranged in one row, and its diameter becomes larger toward the mirror section (or inner frame) and gradually decreases toward the frame (or outer frame).

Figure 10A:
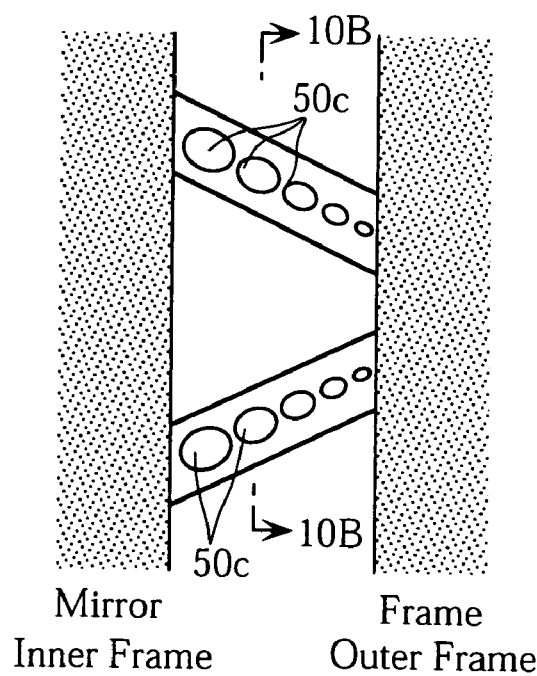
FIG. 10a is a partial expanded plan view showing the fourth example of the structure of a torsion bar which can be adopted in any of the embodiments.
Figure 10B:
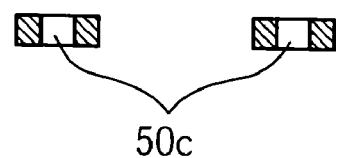

In the fourth example shown in FIGS. 10a and 10b, each torsion bar has a plurality of rigidity adjustment holes 50c of an elliptic cross section arranged in one row, and its diameter becomes larger toward the mirror section (or inner frame) and gradually decreases not only in the lengthwise direction but also in the widthwise direction.

Figure 11A:
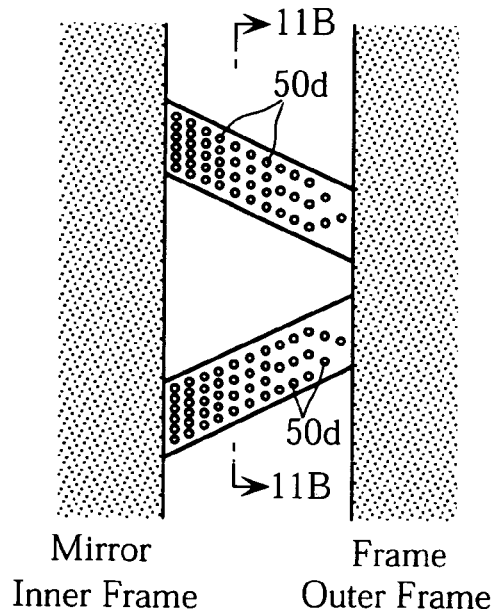
FIG. 11a is a partial expanded plan view showing the fifth example of the structure of a torsion bar which can be adopted in any of the embodiments.
Figure 11B:

In the fifth example shown in FIGS. 11a and 11b, each torsion bar has many rigidity adjustment holes 50d of a circular cross section with the same diameter, and their distribution density becomes higher toward the mirror section (or inner frame) and gradually decreases toward the frame (or outer frame).

Figure 12A:
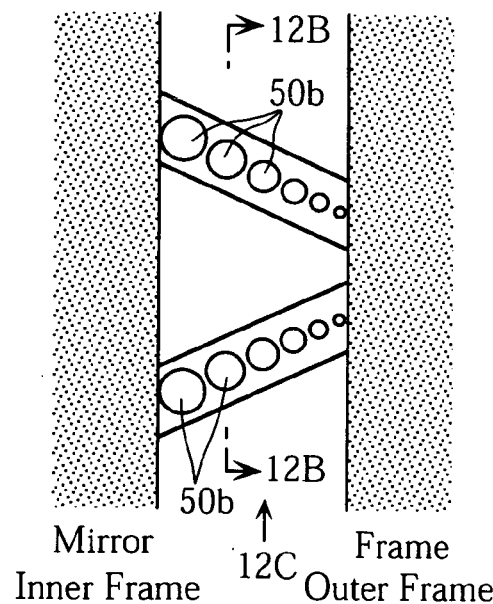
FIG. 12a is a partial expanded plan view showing the sixth example of the structure of a torsion bar which can be adopted in any of the embodiments.
Figure 12B:
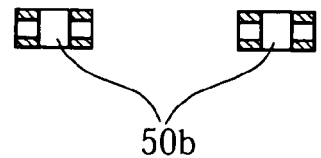
Figure 12C:
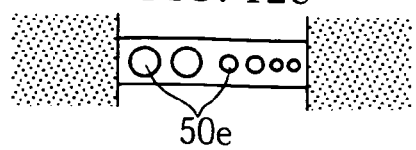

In the sixth example shown in FIGS. 12a and 12b, each torsion bar has an array of rigidity adjustment holes 50b of a circular cross section penetrating in the thickness direction and also an array of rigidity adjustment holes 50e of a circular cross section penetrating in the widthwise direction. Diameters of both the rigidity adjustment holes 50b penetrating in the thickness direction and the rigidity adjustment holes 50e penetrating in the widthwise direction become larger toward the mirror section (or inner frame) and gradually decrease toward the frame (or outer frame).

Figure 13A:
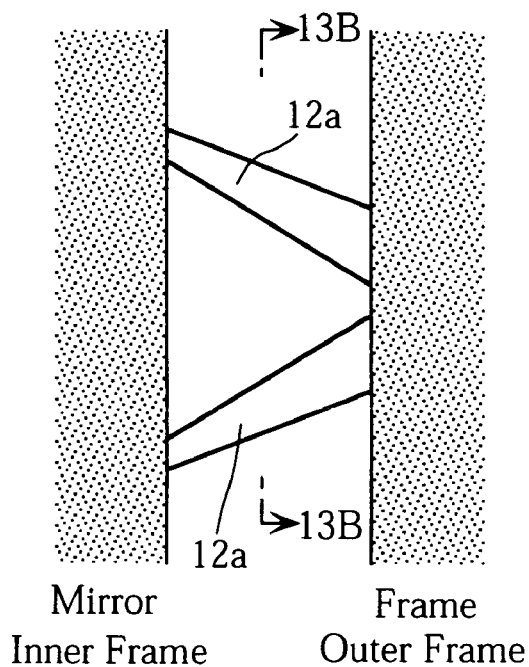
FIG. 13a is a partial expanded plan view showing the seventh example of the structure of a torsion bar which can be adopted in any of the embodiments.
Figure 13B:
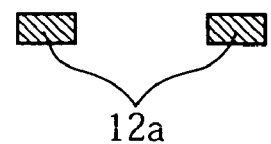

In the seventh example shown in FIGS. 13a and 13b, the width of each torsion bar 12a becomes smaller toward the mirror section (or inner frame) and gradually increases toward the frame (or outer frame).

Figure 14A:
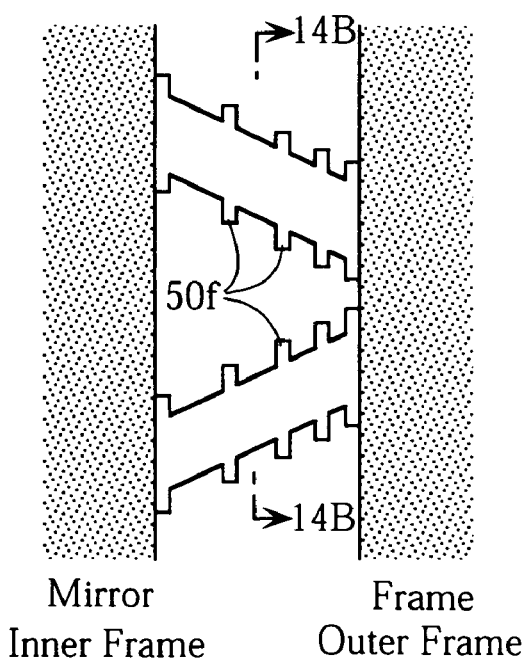
FIG. 14a is a partial expanded plan view showing the eighth example of the structure of a torsion bar which can be adopted in any of the embodiments.
Figure 14B:

In the eighth example shown in FIGS. 14a and 14b, each torsion bar is provided with a plurality of reinforcement ribs 50f, and the interval of these reinforcement ribs 50f becomes larger toward the mirror section (or inner frame) and gradually decreases toward the frame (or outer frame).

Figure 15A:
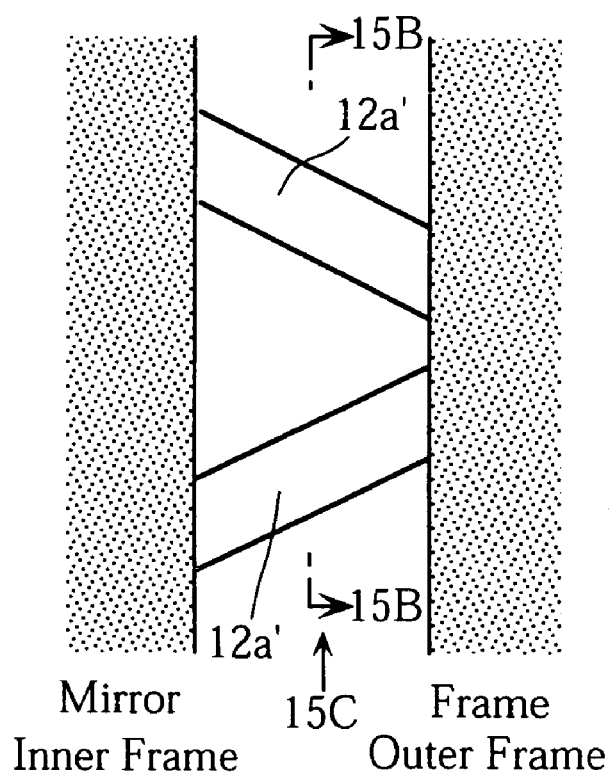
FIG. 15a is a partial expanded plan view showing the ninth example of the structure of a torsion bar which can be adopted in any of the embodiments.
Figure 15B:
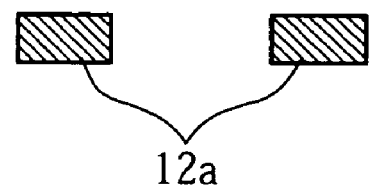
Figure 15C:
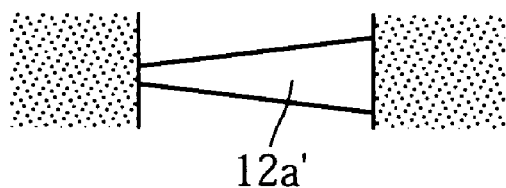

In the ninth example shown in FIGS. 15a~15c, the width of each torsion bar 12a' becomes smaller toward the mirror section (or inner frame) and gradually increases toward the frame (or outer frame).

Figure 16A:
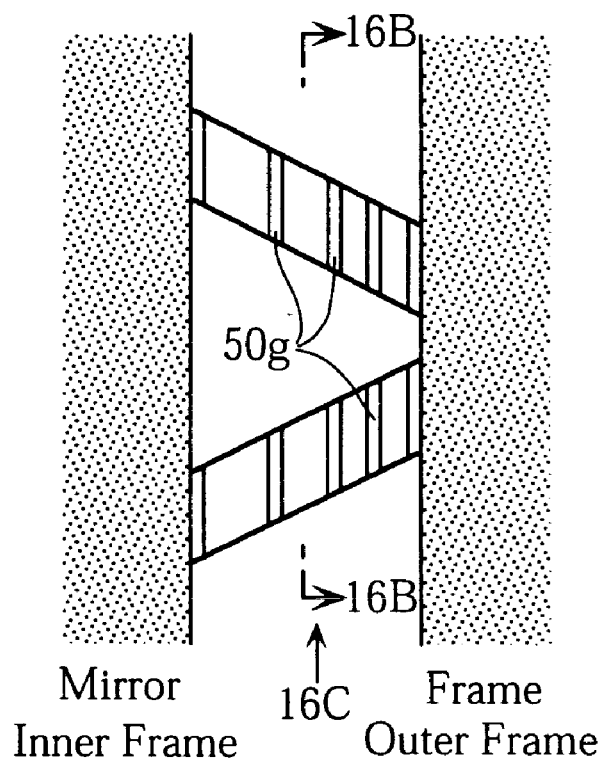
FIG. 16a is a partial expanded plan view showing the tenth example of the structure of a torsion bar which can be adopted in any of the embodiments.
Figure 16B:
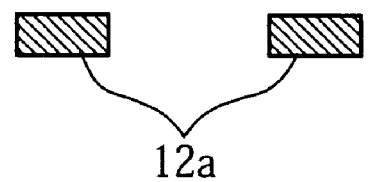
Figure 16C:
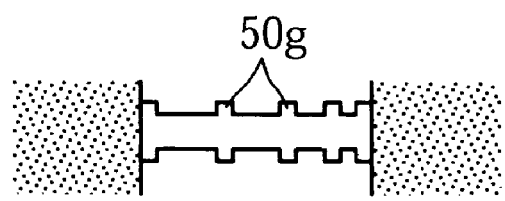

In the tenth example shown in FIGS. 16a~16, each torsion bar is provided with a plurality of reinforcement ribs 50g, and the interval of these reinforcement ribs 50g becomes larger toward the mirror section (or inner frame) and gradually decreases toward the frame (or outer frame).

Figure 17A:
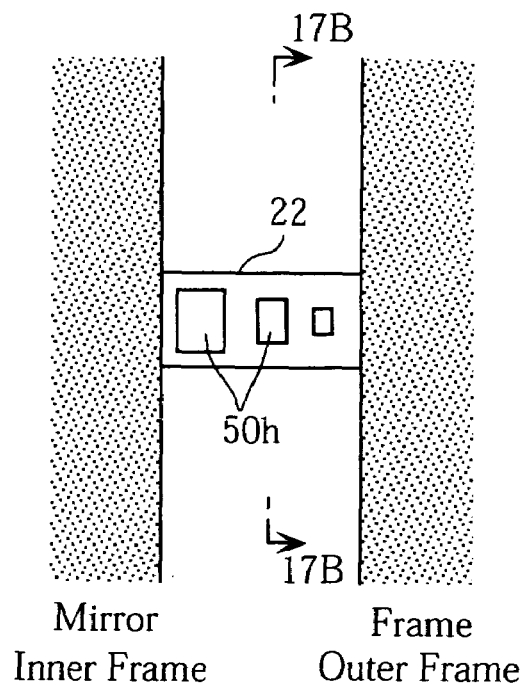
FIG. 17a is a partial expanded plan view showing the eleventh example of the structure of a torsion bar which can be adopted in any of the embodiments.
Figure 17B:
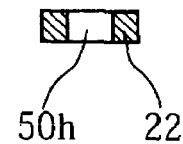

In the eleventh example shown in FIGS. 17a and 17b, each twisting connector is constructed of a single torsion bar 22, and its torsion bar 22 has a plurality of rigidity adjustment holes 50h of a rectangular cross section arranged in a row, and the size becomes larger toward the mirror section (or inner frame) and gradually decreases toward the frame (or outer frame).

Figure 18A:
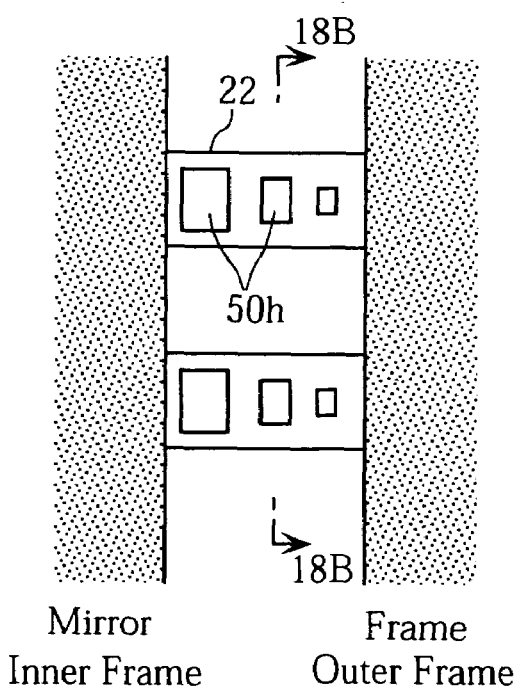
FIG. 18a is a partial expanded plan view showing the twelfth example of the structure of a torsion bar which can be adopted in any of the embodiments.
Figure 18B:
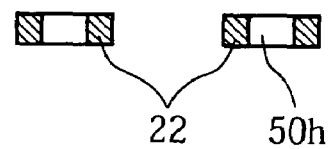

In the twelfth example shown in FIGS. 18a and 18b, each twisting connector is constructed by arranging two torsion bars 22 in parallel having the same construction as those shown in FIGS. 17a and 17b.

Figure 19A:
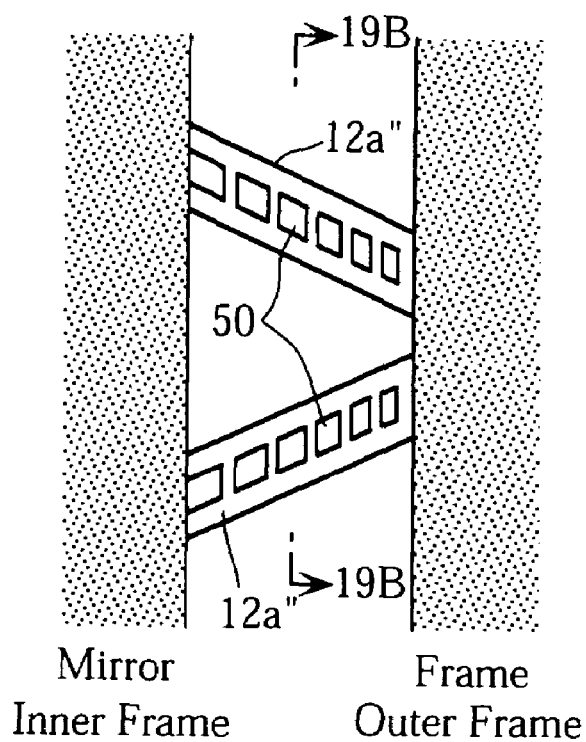
FIG. 19a is a partial expanded plan view showing the thirteenth example of the structure of a torsion bar which can be adopted in any of the embodiments.
Figure 19B:
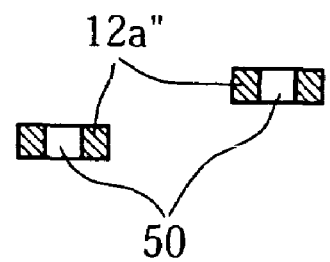
Figure 20:
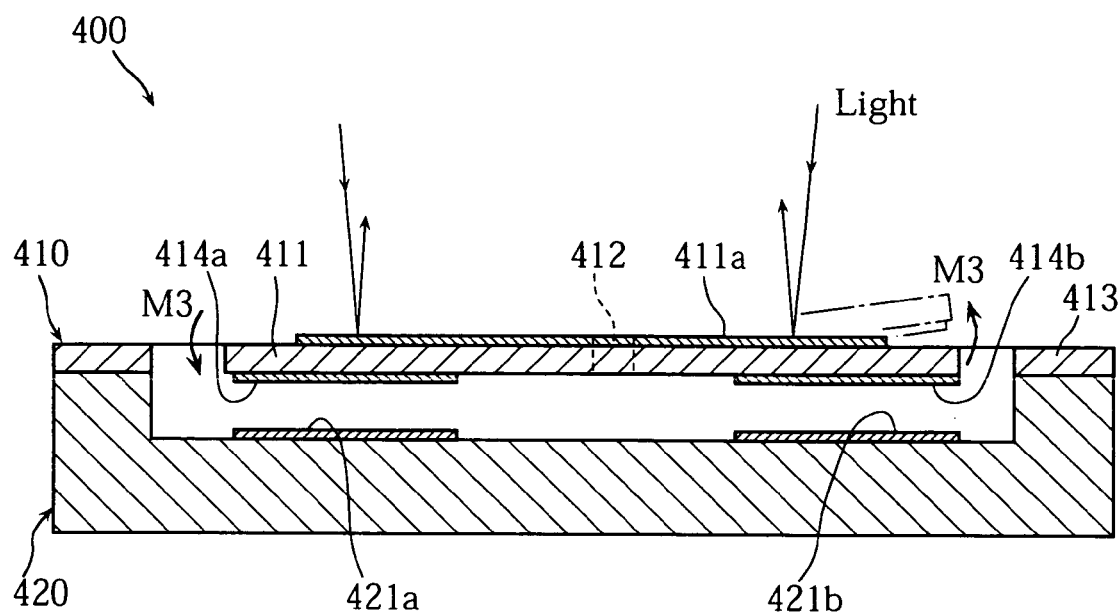
FIG. 20 is a cross-sectional view of a prior-art micro-mirror unit.
Figure 21:
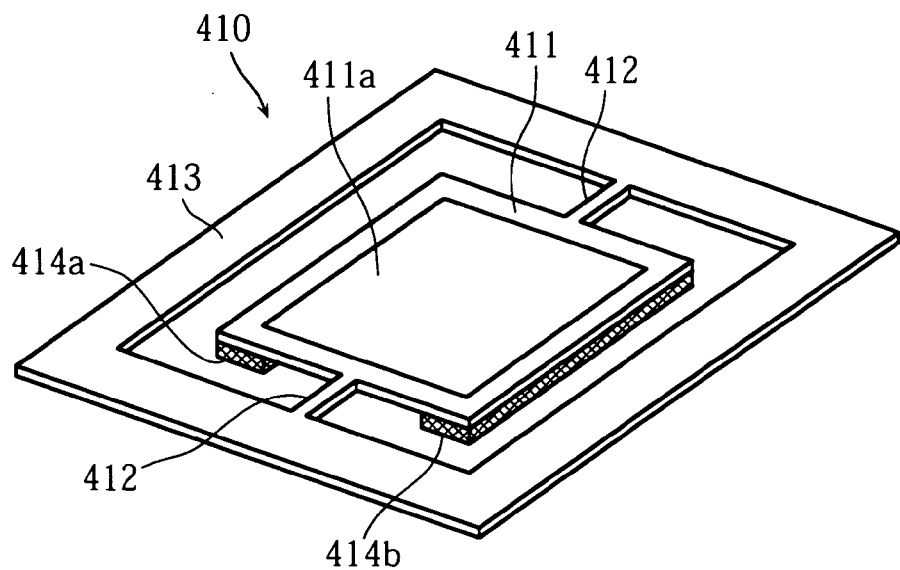
FIG. 21 is an oblique view showing a mirror substrate in the micro-mirror unit shown in FIG. 20.

While the thirteenth example shown in FIGS. 19a and 19b is similar to the first example shown in FIGS. 7a and 7b, the former is different from the latter in that two torsion bars 12a" are shifted from each other in the thickness direction.

Although various kinds of embodiments of the present invention are explained above, the present invention is not limited to these embodiments, but various modifications are possible as far as they do not deviate from the idea and scope described in the attached Scope of Claims.

The invention claimed is:

1. A micro-oscillating element, comprising:
   a frame; and
   an oscillating member connected to the frame via connectors;
   wherein each of the connectors includes two torsion bars having an interval in a widthwise direction, the interval becoming larger toward the oscillating member and gradually decreasing toward the frame, each of the torsion bars being provided with rigidity adjustment means.

2. The micro-oscillating element according to claim 1, wherein the rigidity adjustment means is constructed so that the rigidity of each of the torsion bars becomes relatively high toward the frame and relatively low toward the oscillating member.

3. The micro-oscillating element according to claim 2, wherein the rigidity adjustment means is a plurality of holes formed on the torsion bars.

4. The micro-oscillating element according to claim 3, wherein the size of the holes varies so as to become smaller toward the frame and larger toward the oscillating member.

5. The micro-oscillating element according to claim 3, wherein the density of the holes varies so as to become smaller toward the frame and larger toward the oscillating member.

6. The micro-oscillating element according to claim 3, wherein the plurality of holes penetrate the torsion bars in the thickness direction.

7. The micro-oscillating element according to claim 3, wherein the plurality of holes penetrate the torsion bars in the widthwise direction.

8. The micro-oscillating element according to claim 3, wherein a part of the plurality of holes penetrate the torsion bars in the thickness direction, and the rest of the plurality of holes penetrate the torsion bars in the widthwise direction.

9. The micro-oscillating element according to claim 2, wherein the width of the torsion bars varies so as to become larger toward the frame and smaller toward the oscillating member.

10. The micro-oscillating element according to claim 2, wherein the rigidity adjustment means is provided with a plurality of reinforcement ribs projecting toward the widthwise direction of the torsion bars, the interval of those reinforcement ribs varying so as to become smaller toward the frame and larger toward the oscillating member.

11. The micro-oscillating element according to claim 2, wherein the thickness of the torsion bars varies so as to become larger toward the frame and smaller toward the oscillating member.

12. The micro-oscillating element according to claim 2, wherein the rigidity adjustment means is provided with a plurality of reinforcement ribs projecting toward the thickness direction of the torsion bars, the interval of those reinforcement ribs varying so as to become smaller toward the frame and larger toward the oscillating member.

13. The micro-oscillating element according to claim 12, wherein the two torsion bars are shifted from each other in position in the thickness direction.

14. The micro-oscillating element according to claim 1, wherein the frame constitutes an inner frame, the connector is an inner connector which connects the inner frame with the oscillating member, and further an outer frame is connected to the inner frame via an outer connector, each of the outer connectors including at least one outer torsion bars provided with rigidity adjustment means.

15. The micro-oscillating element according to claim 14 wherein the rigidity adjustment means of the outer torsion bar is constructed so that the rigidity of the outer torsion bar becomes relatively high toward the outer frame and relatively low toward the inner frame.

16. The micro-oscillating element according to claim 14, wherein the oscillating axis of the outer connector perpendicularly intersects with the oscillating axis of the inner connector.

17. A micro-mirror unit comprising a micro-oscillating element according to claim 1, wherein the oscillating member includes a mirror section.

18. A micro-oscillating element, comprising:
   an inner frame;
   an oscillating member connected to the inner frame via inner connectors, each of the inner connectors including at least one inner torsion bar provided with rigidity adjustment means and
   an outer frame connected to the inner frame via an outer connector, the outer connector including at least one outer torsion bar provided with rigidity adjustment means.

* * * * *